United States Patent [19]

Corrie et al.

[11] Patent Number: 4,677,737
[45] Date of Patent: Jul. 7, 1987

[54] SELF ALIGNED ZERO OVERLAP CHARGE COUPLED DEVICE

[75] Inventors: Brian L. Corrie, Gaston; Pauline Benn, Beaverton; Michael J. McElevey, Tigard, all of Oreg.

[73] Assignee: Tektronix, Inc., Beaverton, Oreg.

[21] Appl. No.: 866,423

[22] Filed: May 23, 1986

[51] Int. Cl.[1] .................... H01L 21/00; H01L 21/58; H01L 21/60
[52] U.S. Cl. .................... 29/571; 29/576 W; 29/578; 29/580; 29/591; 156/644; 156/653; 357/24
[58] Field of Search .............. 156/643, 644, 653, 657; 29/571, 577 C, 580, 591

[56] References Cited

U.S. PATENT DOCUMENTS

| | | | |
|---|---|---|---|
| 4,077,112 | 3/1978 | Theunissen et al. | 29/580 |
| 4,084,987 | 4/1978 | Godber | 156/644 |
| 4,319,261 | 3/1982 | Kub | 357/24 |
| 4,351,099 | 9/1982 | Takagi et al. | 29/571 |
| 4,351,100 | 9/1982 | Widmann | 29/577 C |
| 4,352,237 | 10/1982 | Widmann | 29/577 C |
| 4,402,128 | 9/1983 | Blackstone | 29/591 |
| 4,461,070 | 7/1984 | Cline | 29/571 |
| 4,503,450 | 3/1985 | Brewer | 357/24 M |
| 4,574,468 | 3/1986 | Slotboom et al. | 29/591 |
| 4,614,564 | 9/1986 | Sheldon et al. | 156/657 |

OTHER PUBLICATIONS

IEEE Trans. on Electron Devices, vol. ED-21, No. 11, Nov. 1974, pp. 712-720, "Charge-Coupled Area Image Sense Using Three Levels of Polysilicon".

Primary Examiner—Brian E. Hearn
Assistant Examiner—Chi-Tso Huang
Attorney, Agent, or Firm—William S. Lovell; Alexander C. Johnson, Jr.

[57] ABSTRACT

A self aligned, nonoverlapping gate structure for a charge coupled device is fabricated by depositing three sets of interleaved polysilicon gate electrodes. The first set of electrodes is applied in a planar form and sized to a width of about one-third the spacing of the electrodes of the first set. The second and third sets of electrodes are applied to overlap, in turn, portions of the previously applied electrodes. A thick shield layer of SiO$_2$ is deposited and patterned atop the first and second sets of gate electrodes. After deposition of the third set of electrodes, the shield layers are removed to provide passageways extending beneath the overlapping portions of the second and third sets of electrodes. Such overlapping portions are then removed by etching through the passageways, to produce a nonoverlapping, generally planar gate structure.

16 Claims, 5 Drawing Figures

SELF ALIGNED ZERO OVERLAP CHARGE COUPLED DEVICE

BACKGROUND OF THE INVENTION

This invention relates to the fabrication of integrated circuit gate structures, and more particularly to a method for making a self-aligned, nonoverlapping gate structure for a charge coupled device (CCD).

An ideal gate structure for a CCD has a series of elongated, narrow conductors formed on the surface of a semiconductor substrate in alignment with underlying, doped charge-storage regions. The conductors are closely spaced but separated by a thin, insulative layer or dielectric. Ideally, the adjacent conductors do not overlap. In practice, however, conventional fabrication techniques cannot assure perfect alignment of the gate electrodes to avoid discontinuities in the gate structure. Alignment becomes even more difficult as device dimensions are reduced, for example, to increase resolution in optical CCDs.

Consequently, most commercially available CCD are fabricated with an overlapping gate structure, for example, as shown in FIG. 1 of U.S. Pat. No. 4,319,261 to Kub. It is recognized that such devices exhibit overlap capacitance, which can be disadvantageous in their operation for many applications. Employing such an overlap also limits the ability to reduce device size. A practical limit to gate width, using conventional photolithographic techniques is 4 $\mu$m., and using electron beam technology is about 2 $\mu$m. Another drawback is that overlapping gate designs are prone to shorting along the overlap. This problem limits operative device yields and makes wafer-scale integration almost impossible.

Various proposals have been made to fabricate nonoverlapping gate structures in CCDs. The aforementioned patent to Kub suggests forming alternate, doped polysilicon gate conductors at different elevations from the substrate surface. The elevated gates are spaced from the substrate and the adjacent, non-elevated conductors by a thickness of undoped polysilicon. U.S. Pat. No. 4,461,070 to Cline applies thin film lamellar metallic eutectic gates, and selectively removes one of the eutectic phases to form one of the spaced gate arrays. After applying an insulative layer, another conductive layer is applied and etched to form the intervening gates. Some overlap results in this process.

U.S. Pat. Nos. 4,351,100 and 4,352,237 to Widmann disclose two related but different self-adjusting, nonoverlapping CCD gate processes as follows: a first polysilicon layer is deposited and covered with a layer of silicon dioxide. These layers are patterned and etched to form spaced poly-Si-1 electrodes that are initially somewhat larger than their final width. Then, the first polysilicon layer is undercut beneath the silicon dioxide cover to produce pairs of confronting $SiO_2$ overhangs with gaps therebetween. Oxidizing provides an insulating layer at the end faces of the poly-Si-1 electrodes. Then, a second polysilicon layer is applied by chemical vapor deposition (CVD) so as to fill the cavities beneath the two overhangs. Any excess polysilicon deposited atop the $SiO_2$ cover layer is then etched away so as to leave the intervening self adjusting, nonoverlapping poly-Si-2 electrodes.

One drawback in the process of Widmann U.S. Pat. No. 4,352,237 is that it requires very small gap geometry, 1.6 to 1.8 $\mu$m. gap width. It will not provide a planar poly-Si-2 layer if the gap is too wide, e.g., 3 $\mu$m. Consequently, it cannot be used in large-sized imagers which are needed in situations requiring large dynamic range and low noise, such as astronomy. It also cannot be used in a three-layer polysilicon—3-phase process. The process of Widmann U.S. Pat. No. 4,351,100 is vulnerable to alignment inaccuracies and, therefore, would not increase yields over devices made by conventional techniques.

Accordingly, a need remains for a satisfactory method of making nonoverlapping gate structures for CCDs and other semiconductor devices.

SUMMARY OF THE INVENTION

One object of the invention is to provide an improved method of making self aligned CCD gate structures.

A second object is to improve the yield of charge coupled devices.

Another object of the invention is to enable a reduction in gate structure dimensions without foreclosing the ability to make large-area imagers by the same process.

A further object is to provide a method that can be used in making three-layer polysilicon, three-phase gate structures.

An additional object is to eliminate shorting between adjacent electrodes.

The invention provides a method of making CCD gate structures which includes forming a poly-Si-1 electrode, forming dielectric sidewalls on opposite sides of the poly-Si-1 electrode, and forming a poly-Si-2 electrode next to and overlapping the poly-Si-1 electrode. Before applying the poly-Si-2 electrode, a shield layer is deposited atop the poly-Si-1 electrode, to space the overlapping portion of the poly-Si-2 electrode a distance above the poly-Si-1 electrode. The shield layer is then removed, for example, by etching, to expose an underside of the overlapping portion of the poly-Si-2 layer. Then, using the space formerly occupied by the shield layer as a channel or passageway, the overlapping portion of the poly-Si-2 electrode is etched away, leaving behind nonoverlapping poly-Si-1 and poly-Si-2 electrodes abutting at and insulatively spaced apart about the dielectric layer. The etching step assures that no conductive polysilicon material extends across the dielectric layer between the two gate electrodes.

The foregoing procedure can be extended to include forming a pair of poly-Si-3 electrodes on opposite sides of the combined poly-Si-1 and poly-Si-2 gate structure. The poly-Si-3 electrodes are initially applied in overlapping form, and spaced from the preceding gate structures by a second shield layer, as was the poly-Si-2 electrode. The first and second shield layers are simultaneously removed and all of the overlapping portions of the poly-Si-2 and poly-Si-3 layers can be simultaneously removed.

The foregoing method is illustrated in two alternate embodiments. In the first embodiment, each of the polysilicon layers can be covered with a protective layer that is resistant to an etch which is specific to polysilicon. In this embodiment, the overlapping portions of the poly-Si-2 and poly-Si-3 layers are etched only from below, through the passageway left by removal of the shield layers. In the second embodiment, the protective layer is omitted, allowing the overlapping portions of the poly-Si-2 and poly-Si-3 electrodes to be etched from both above and below. The polysilicon electrodes are deposited in a sufficient thickness that, after etching away half of such thickness, they still provide sufficient conductivity for satisfactory operation of the device.

The foregoing and other objects, features and advantages of the invention will become more readily apparent from the following detailed description, which proceeds with reference to the accompanying drawings.

DETAILED EMBODIMENT

In the following description, various abbreviations are used that are recognized by those skilled in the art of fabrication of charge coupled devices (CCDs). Examples of abbreviations used include the term poly-Si-1 to indicate the first-applied gate electrode, thermal $SiO_2$ for thermally grown silicon dioxide, CVD $SiO_2$ for a chemical vapor deposited silicon dioxide, etc. Although the invention is preferably carried out employing the specific combination of materials disclosed herein, persons skilled in the art will recognize that alternative materials can be used, with appropriate choices of etchants and patterning procedures, while employing the principles of the invention disclosed herein. Also, to aid in understanding how to make and use the invention, illustrative dimensions are included in the description. These dimensions are all approximate within the tolerances conventionally attainable by those skilled n the art using conventional processing apparatus, and are included merely by way of example and not of limitation.

Figure 1:
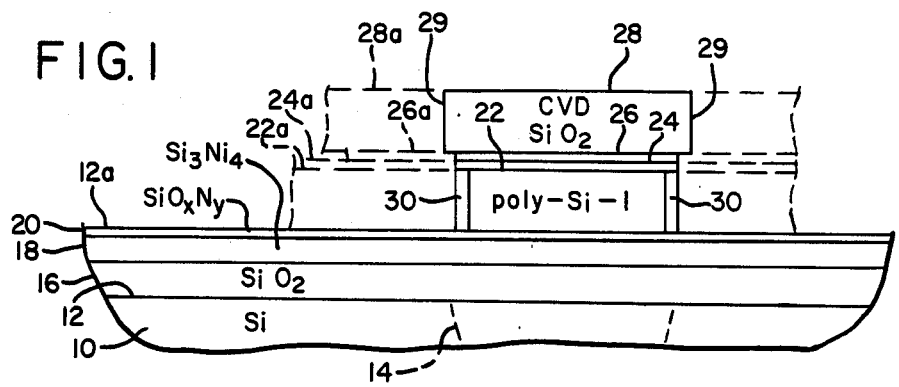
FIG. 1 is a cross-sectional diagram of a portion of a substrate during fabrication of a charge coupled device, thereon showing a poly-Si-1 electrode formed on the device.

Referring to FIG. 1, a silicon substrate 10 having a planar reference surface 12 is provided. The substrate can have an epitaxial silicon surface layer, or a silicon wafer can be used. The substrate is masked and ion implanted in accordance with conventional techniques to form CCD storage regions, such as region 14, within the substrate. These steps, being generally known in the art and forming no part of the invention except that the gate structure formed by the invention is aligned with such regions, are not further described.

The gate oxide layer 16 (400 Å–1,200 Å) is grown atop the substrate. This step is followed by a chemical vapor deposition of a nitride ($Si_3N_4$) layer 18 (400 Å–1,000 Å). Optionally, the surface of layer 18 is oxidized to provide a nitride oxide ($SiO_xN_y$) layer 20 (75 Å–100 Å). The gate structure of the invention is then constructed atop the resultant surface 12a.

First, poly-Si-1 electrode layer 22a is deposited (4,000 Å–8,000 Å) atop surface 12a and oxidized to provide a covering $SiO_2$ layer 24a (400 Å–1,000 Å). Next, a nitride ($Si_3N_4$) layer 26a is deposited (600 Å–1,200 Å). Finally, a $SiO_2$ layer 28a is chemical vapor deposited to provide a first shield layer (8,000 Å–12,000 Å) over the poly-Si-1 layer. The CVD $SiO_2$ layer 28a is densified by annealing.

Next is the first polysilicon gate photolithography step, to form the poly-Si-1 gate electrodes 22, one of which is shown in FIG. 1. As illustrated and described in connection with subsequent figures, three separate sets of gates are produced by this process. Accordingly, the first photolithography step includes masking a predetermined gate width at intervals of three gate widths. Only one such poly-Si-1 gate electrode is shown in the figures, but it will be understood that additional such poly-Si-1 gates electrodes 22 are used, spaced out of the views in the Figures.

After masking and developing, the intermediate gate structure shown in FIG. 1 is produced by four successive etching steps. The first etching step employs a buffered HF (hydrofluoric) etch to remove the unmasked portions of CVD $SiO_2$ layer 28a to produce shield 28, with parallel, opposite sidewalls 29. Next, layer 26a is plasma etched using a gas such as Freon, that leaves the photoresist layer (not shown) intact atop shield 28. This is followed by a second HF etch to pattern $SiO_2$ layer 24. Layers 24, 26 are etched sufficiently to slightly undercut layer 28. Then, layer 22a is plasma etched to produce the poly-Si-1 gate electrode 22.

Next follows a thermal oxidation step to oxidize the sidewalls of poly-Si-1 layer 22 to provide a dielectric ($SiO_2$) layer 30 (700 Å–1,000 Å) thereon. This step completes the procedure of forming the first set of polysilicon gate electrodes.

Figure 2:
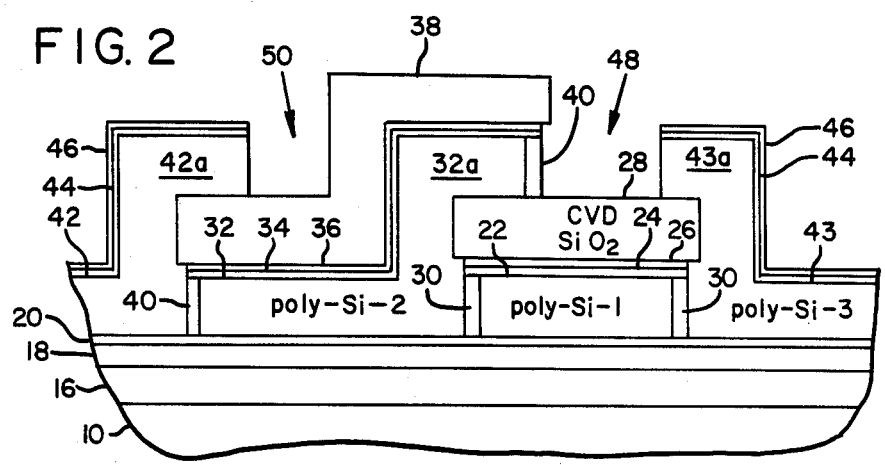
FIG. 2 illustrates a subsequent step in the fabrication of the device of FIG. 1, following deposition of poly-Si-2 and poly-Si-3 gate structures.

Referring to FIG. 2, the above-described steps of polysilicon deposition, thermal oxidation, nitride deposition, CVC $SiO_2$ deposition and annealing steps are repeated. The resultant layers are patterned and selectively etched in accordance with the previously described procedures to produce a poly-Si-2 gate electrode 32, covered in turn by an $SiO_2$ layer 34, nitride layer 36 and a densified CVD $SiO_2$ layer 38. The poly-Si-2 layer is positioned to one side of the poly-Si-1 layer, abutting against dielectric layer 30, and is sized to overlap one side of the poly-Si-1 layer and its shield and protective layers 22, 24, 26. The overlapping portion is designated by reference numeral 32a. A thermal oxidation step provides $SiO_2$ dielectric layers 40 on the sidewalls of the poly-Si-2 layer.

The prodecure described in the preceding paragraph is again repeated, except for the omission of the CVD $SiO_2$ deposition and annealing steps, to provide poly-Si-3 gate electrodes 42, 43, one positioned on each side of the poly-Si-1 and poly-Si-2 gate electrodes. Electrode 42 has an overlapping portion 42a which overlaps one side of the poly-Si-2 electrode and its protective and shield layers 32, 34, 36 at a position relmote from the poly-Si-1 electrode. Electrode 43 has an overlapping portion 43a which overlaps one side of the poly-Si-1 electrode 22 and its covering layers 24, 26, 28. The poly-Si-3 layer is covered by protective oxide and nitride layers 44, 46. These layers are etched in a manner previously described to define separate electrodes 42, 43 and provide openings 48, 50 which expose the upper surfaces of CVD $SiO_2$ layers 28, 38, respectively. Thermal oxidation of the poly-Si-3 electrodes after patterning and etching is unnecessary.

Figure 3:
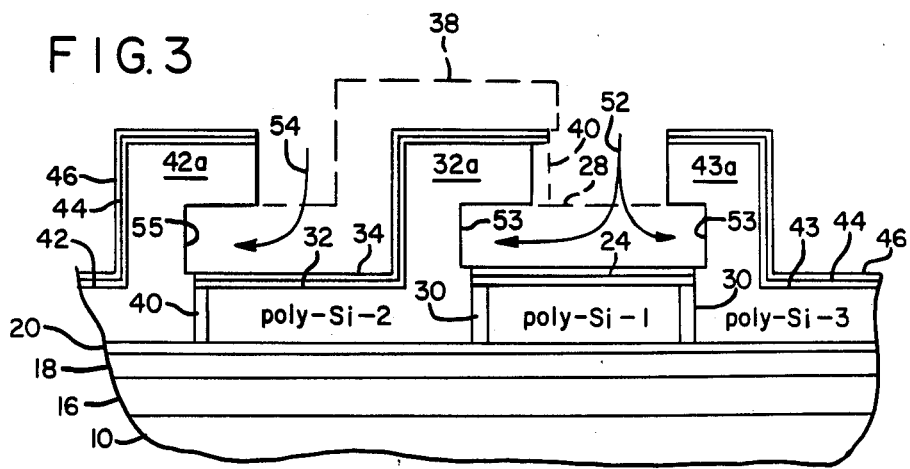
FIG. 3 illustrates a subsequent step in the processing of the device of FIG. 2, following removal of $SiO_2$ shield layers.

Referring to FIG. 3, the CVD SiO₂ layers 28, 38 are selectively HF etched (10(NH₄)₂F):HF) to remove the entirety of material of the shield layers 28, 38. This step undercuts the overlapping portions 32a, 42a, 43a of the poly-Si-2 and poly-Si-3 electrodes. This step provides passageways 52, 54 wherein are exposed the undersurfaces 53, 55 of the overhanging portions 32a, 42a, 43a of the poly-Si-2 and poly-Si-3 layers.

Next is a wet chemical etching step, which can use any of the available wet chemical silicon etchants, e.g., ECD etch. When the CVD SiO₂ shield layers 28, 38 are originally deposited, they are deposited to a sufficient thickness (8,000 Å–12,000 Å) to provide passageways 52, 54 of a width that permits circulation of the etchant. This step etches away the overlapping portions 32a, 42a, 43a of the poly-Si-2 and poly-Si-3 gate electrodes. An an alternative to wet chemical etching, the overhanging portions can be removed by oxidizing the exposed polysilicon and stripping away the oxide.

Figure 4:
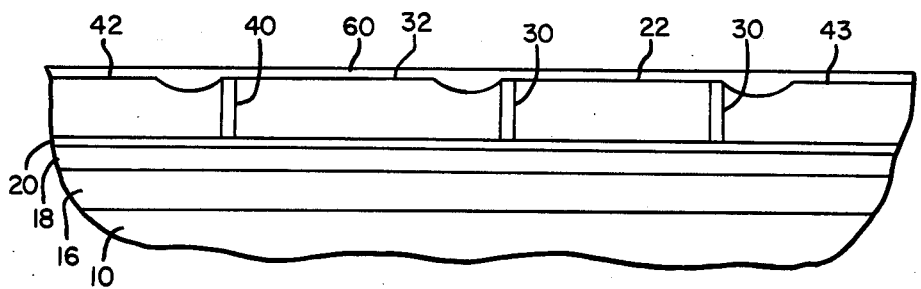
FIG. 4 shows a later step in the fabrication of the device of FIG. 3, following etching away of the overlapping portions of the poly-Si-2 and poly-Si-3 electrodes, to produce the final, nonoverlapping gate structure.

FIG. 4 shows the structure of FIG. 3 following the last described etching step and two additional steps: first, plasma etching to remove the nitride layers 24, 34, 44 and, second, thermal oxidation to grow a thermal oxide layer 60 (2,000 Å) on the upper surface of the gate electrodes. Next, the device is patterned and implanted to dope the source, drain and gate contacts annealed and further processed in accordance with conventional procedures to complete the device.

Figure 5:
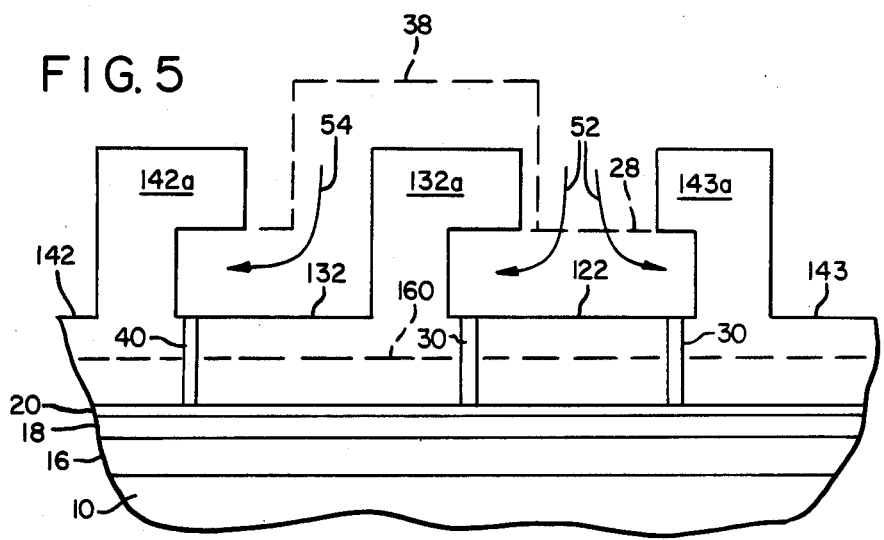
FIG. 5 is a cross-sectional diagram of an alternative embodiment of the invention corresponding to the stage of fabrication illustrated in FIG. 3.

In the above-described embodiment of the process of the invention, nitride layers 24, 34, 44 serve to shield the polysilicon gate electrodes during removal of the overlapping portions of the poly-Si-2 and poly-Si-3 electrodes. A second embodiment of the process, illustrated in FIG. 5, omits the use of such protective layers. Instead, during the polysilicon deposition steps, the polysilicon layers 122, 132, 142, 143, corresponding to the layers 22, 32, 42 and 43 of FIG. 3, respectively, are grown to a somewhat greater thickness (8,000 Å–12,000 Å). During the step of removal of the CVD SiO₂ shield layers, overhanging portions 132a, 142a, 143a, likewise corresponding to 32a, 42a and 43a of FIG. 3, are etched not only via passages 52, 54 but on their upper surfaces as well. Etching for a period of time sufficient to remove half of the deposited thickness of the polysilicon layers is sufficient to remove the entire overhanging portions while leaving roughly half of the deposited thickness (3,000 Å–4,000 Å) of the deposited thickness in in contact with the substrate surface. The amount of polysilicon deposited is thus predetermined so as to provide a final thickness of the conductors sufficient to yield the necessary conductivity characteristics of the gate electrodes.

The foregoing procedure provides a substantially planar, self aligned, nonoverlapping gate structure. Inter-contact shorting is reduced with concomitant improvements in yield of operative devices sufficient to make possible wafer-scale integrated CCDs. Such result is attributable to elimination of the overlapping gate structures, separated by relatively thin dielectric layers, as used in prior devices, and may be aided by the fact that the uppermost ends of the dielectric sidewall layers 30, 40, which insulatively separate the gate electrodes, are cleansed of potentially semiconductive polysilicon material by the successive plasma and chemical etch and final thermal oxidation steps at the upper surface of the contacts.

Having illustrated and described the principles of our invention in two alternative embodiments and variations thereof, it should be apparent that the invention may be modified in arrangement and detail without departing from the principles thereof. We claim all modifications coming within the spirit and scope of the following claims.

We claim:

1. A method of making a self-aligned nonoverlapping charge-coupled device gate structure on a semiconductor substrate surface, the method comprising:

forming a poly-Si-1 electrode on the substrate surface, a first SiO₂ shield layer atop the electrode, and SiO₂ sidewalls on opposite sides of the electrode;

forming a poly-Si-2 electrode on the substrate surface on one side of the poly-Si-1 electrode and overlapping lapping a predetermined portion of the first shield layer, a second SiO₂ layer atop the poly-Si-2 electrode, and SiO₂ sidewalls on opposite sides of the poly-Si-2 electrode;

forming two poly-Si-3 electrodes on the substrate surface, along opposite sides of the first and second shield layers of the poly-Si-1 and poly-Si-2 electrodes and overlapping said opposite sides, so as to provide four electrodes spaced side by side along the substrate surface and separated by the SiO₂ sidewalls;

removing the shield layers to form passageways exposing overlapping portions of the poly-Si-2 and poly-Si-3 electrodes; and etching away said overlapping portions of the poly-Si-2 and poly-Si-3 electrodes, the SiO₂ shield layers being formed with a predetermined thickness such that, upon removal, the passageways can readily circulate a polysilicon etchant into contact with said overlapping portions.

2. A method according to claim 1, including forming the shield layers with sides substantially aligned with the SiO₂ sidewalls of the electrodes.

3. A method according to claim 1, including forming each of said gate electrodes to a predetermined thickness and etching away said overlapping portions from opposite sides in an amount slightly exceeding one-half of said thickness such that a portion of said thickness remains in contact with the substrate surface.

4. A method according to claim 1, including applying an etch-resistant layer to an upper surface of each electrode, to resist etching thereof during the aforesaid etching step.

5. A method of making adjacent gate structures on a semiconductor substrate having a reference surface, comprising:

depositing a first conductive gate layer on the reference surface of the substrate;

depositing a first shield layer atop the conductive gate layer;

patterning and etching the first shield and gate layers, using first and second etchants, in turn, for selectively etching first predetermined portions of the first shield and gate layers to form exposed sidewalls on the layers, the sidewall of the gate layer extending between the shield layer and the reference surface and a first adjoining portion of the reference surface being thereby exposed;

forming a first dielectric layer on the sidewall of the first gate layer;

depositing a second conductive gate layer over the reference surface and the first gate, shield and dielectric layers;

forming an opening through the second gate layer to expose a portion of the surface of the shield layer;

using said first etchant, selectively etching through said opening to remove the shield layer between the first and second conductive gate layers to undercut a portion of the second conductive gate layer and to expose a sidewall portion thereof upwardly adjacent the dielectric layer; and subsequently, using said second etchant, selectively etching away the undercut and sidewall portions of the second gate layers so as to produce a nonoverlapping arrangement of the first and second gate layers insulatively spaced apart by said dielectric layer.

6. A method according to claim 5 including, prior to forming said opening:

depositing a second shield layer atop the second conductive gate layer;

patterning and etching second predetermined portions of the second gate and shield layers, using said first and second etchants in turn, to form sidewalls on the second layers, the sidewall of the second gate layer extending between the second shield layer and the reference surface, and to expose a second, adjoining portion of the reference surface at a position spaced apart from the first conductive layer by a remaining portion of the second layer;

forming a second dielectric layer on the sidewall of the second gate layer; and depositing a third conductive gate layer over the exposed second portion of the substrate reference surface and the second shield layer;

the step of forming an opening including exposing the second shield layer over a portion of the remaining second gate layer so that the step of selectively etching throught the opening using said first etchant also removes the second shield layer to undercut and expose a portion of the third gate layer upwardly adjacent the second dielectric layer for subsequently selectively etching away using the second etchant.

7. A method according to claim 5 including depositing the shield layer to a predetermined thickness to form, upon etching to remove the shield layer, a channel between the first and second gate layers of sufficient width for the second etchant to flow into contact with the undercut and exposed sidewall portions of the second gate layer.

8. A method according to claim 5 including deposited a gate-etch resistant layer atop each of the first and second gate layers to protect same during the step of subsequently selectively etching away the undercut and exposed sidewall portions.

9. A method according to claim 5 including:

depositing the gate layers to a first predetermined thickness;

exposing an upper surface of the second gate layer opposite said undercut and exposed sidewall portions; and etching the second layer at both the upper surface and the undercut and exposed sidewall portions to remove the layer therebetween while leaving a second predetermined thickness of the second gate layer on the reference surface.

10. A method according to claim 5 in which the step of forming an opening through the second gate layer includes patterning and etching a predetermined portion thereof away from atop the first shield layer and from along one side of the first gate layer to provide a gate contact opening for a third gate layer to be applied and to form a sidewall of the second gate layer which intersects the reference surface.

11. A method according to claim 10 including forming a dielectric on the sidewall of the second gate layer.

12. A method for making multiple adjacent gate structures in a charge coupled device including a semiconductor substrate having a reference surface, the method comprising:

providing a plasma-etch resistant layer on the reference surface to define a second reference surface, depositing a first layer of plasma-etchable, polysilicion material on the plasma etch-resistant layer;

depositing a first shield layer atop an upper surface of the polysilicion layer, the shield layer being composed of a nonoxidizable, chemically-etchable material;

patterning and etching the shield and polysilicon layers in turn to form a first polysilicon gate contact and an adjacent second gate contact opening, the first contact having an exposed sidewall intersecting the second reference surface and defining a boundary of the second gate contact opening;

oxidizing the exposed sidewall of the first polysilicon gate contact to form thereon a dielectric sidewall layer of predetermined thickness spacing the first gate contact from the boundary of the second gate contact opening, the shield layer shielding the upper surface of the polysilicion gate contact from oxidation;

depositing a second layer of said polysilicon material so as to cover contiguously the oxidized layer in the second gate contact opening and the dielectric sidewall layer while leaving an upper surface portion of the shield layer exposed;

selectively etching the shield layer to remove the material thereof and from a passageway exposing an undersurface portion of the second polysilicon layer extending above the first polysilicon layer; and selectively etching the exposed portion of the second polysilicon layer through said passageway to remove said portion.

13. A method according to claim 12 in which the shield layer is formed of $SiO_2$ and is selectively etched by a chemical etchant to which silicon is etch-resistant.

14. A method according to claim 12 in which the exposed portion of the second polysilicon layer is removed by plasma etching.

15. A method according to claim 12 in which the exposed portion of the second polysilicon layer is removed by wet chemical etching.

16. A method according to claim 12 in which the exposed portion of the second polysilicon layer is removed by oxidizing and stripping.

* * * * *